United States Patent
Burns et al.

(10) Patent No.: US 6,258,679 B1
(45) Date of Patent: Jul. 10, 2001

(54) SACRIFICIAL SILICON SIDEWALL FOR DAMASCENE GATE FORMATION

(75) Inventors: Stuart M. Burns, Brookfield, CT (US); Hussein I. Hanafi, Basking Ridge, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/467,534

(22) Filed: Dec. 20, 1999

(51) Int. Cl.[7] .................................................. H01L 21/336
(52) U.S. Cl. .............................................. 438/303; 438/595
(58) Field of Search ..................................... 438/184, 197, 438/211, 221, 222, 229, 230, 259, 269, 270, 299, 303, 585, 595, 596, 700, 706, 719, 723, 724

(56) References Cited

U.S. PATENT DOCUMENTS

| | | |
|---|---|---|
| 4,430,791 | 2/1984 | Dockerty . |
| 4,636,822 | 1/1987 | Codella et al. . |
| 4,758,528 | 7/1988 | Goth et al. . |
| 5,434,093 | * 7/1995 | Chau et al. . |
| 5,464,782 | * 11/1995 | Koh . |
| 5,466,615 | * 11/1995 | Tsai . |
| 5,472,897 | * 12/1995 | Hsu et al. ............................ 438/303 |
| 5,538,913 | * 7/1996 | Hong . |
| 5,654,218 | * 8/1997 | Lee . |
| 5,688,704 | * 11/1997 | Liu . |
| 5,963,818 | * 10/1999 | Kao et al. ............................ 438/424 |
| 5,985,726 | * 11/1999 | Yu et al. .............................. 438/301 |
| 6,001,698 | * 12/1999 | Kuroda ................................ 438/303 |

(List continued on next page.)

FOREIGN PATENT DOCUMENTS

327702 * 7/1997 (TW) .

OTHER PUBLICATIONS

Yagishita et al "Reduction of threshold voltager deviation in damascene metal gate MOSFETs", IEDM 99, pp. 10.5.1–10.5.4, 1999.*

Ma et al "Damascene–Gate thin film transistors with ultra thin gate dielectrics" IEEE 1998, p. 132–133.*

R.A. Colclaser, John Wiley & Sons, "Microelectronics: Processing and Device Design, " 1980, Chapter 10, pp. 266–269.

Primary Examiner—Savitri Mulpuri
(74) Attorney, Agent, or Firm—Scully, Scott, Murphy & Presser; Tiffany L. Townsend

(57) ABSTRACT

A method of fabricating MOSFET devices in which the gate polysilicon is not consumed during damascene etch back, comprising: (a) forming a gate stack on a surface of a silicon-containing substrate, said gate stack having at least a pad oxide layer formed on said surface of said silicon-containing substrate and a nitride layer formed on said pad oxide layer; (b) forming a trough in said gate stack stopping on said pad oxide layer exposing a portion of said pad oxide layer, said trough having vertical sidewalls; (c) forming a conformal silicon layer on said gate stack and in said trough, including said vertical sidewalls and said exposed pad oxide layer; (d) removing the conformal silicon layer from said gate stack and said exposed pad oxide layer whereby silicon remains on the vertical sidewalls of said trough; (e) removing the exposed pad oxide from said trough exposing a portion of the silicon-containing substrate; (f) oxidizing the silicon on said vertical sidewalls of the trough and in said exposed silicon-containing substrate forming oxide layers in said vertical sidewalls and on said exposed silicon-containing substrate; (g) forming doped polysilicon in said trough; (h) performing a second oxidation step in which an oxide layer is formed on a top surface of said doped polysilicon; (i) removing the remaining nitride layer of the gate stack forming a gate region which is protected on all sides by oxides; and (j) forming source and drain regions in said silicon-containing substrate.

24 Claims, 2 Drawing Sheets

U.S. PATENT DOCUMENTS

| | | | |
|---|---|---|---|
| 6,008,097 | * | 12/1999 | Yoon et al. .......................... 438/303 |
| 6,015,727 | * | 1/2000 | Wanlass .............................. 438/218 |
| 6,025,235 | * | 2/2000 | Krivokapic ......................... 438/303 |
| 6,054,355 | * | 4/2000 | Inumiya et al. .................... 438/296 |
| 6,063,699 | * | 5/2000 | Hanfi et al. ......................... 438/589 |
| 6,077,733 | * | 6/2000 | Chen et al. ......................... 438/182 |
| 6,107,140 | * | 8/2000 | Lee et al. ............................ 438/259 |
| 6,114,206 | * | 9/2000 | Yu ........................................ 438/270 |
| 6,117,741 | * | 9/2000 | Chattergee et al. ................ 438/585 |
| 6,162,688 | * | 12/2000 | Gardner et al. .................... 438/289 |
| 6,169,003 | * | 1/2001 | Hu et al. .............................. 438/299 |
| 6,194,301 | * | 2/2001 | Radens et al. ...................... 438/597 |
| 6,200,865 | * | 3/2001 | Gardner et al. .................... 438/291 |
| 6,204,133 | * | 3/2001 | Yu et al. .............................. 438/299 |

* cited by examiner

SACRIFICIAL SILICON SIDEWALL FOR DAMASCENE GATE FORMATION

FIELD OF THE INVENTION

The present invention relates to a method of fabricating metal oxide semiconductor field effect transistors (MOSFETs), and more particular to a method for damascene gate formation wherein a sacrificial silicon sidewall is employed during the processing.

BACKGROUND OF THE INVENTION

In complementary metal oxide semiconductor (CMOS) processing, sub-0.05 μm field effect transistor (FET) devices must be fabricated using techniques in which the gate region is formed from an etch process that exhibits a high selectivity rate (>30:1) while maintaining vertical sidewalls. One problem with using conventional processing is that $n^+$- and $p^+$-polysilicon have different etch rates; this results in the requirement of pre-doped polysilicon gate etch with even higher selectivity to oxide.

To avoid the above problem with prior art fabrication processes, a damascene technique is employed in fabricating the gate region of the CMOS structure. In the formation of a gate region utilizing a prior art damascene technique, a trough (or gate hole) is defined in a stack which consists of various material layers, e.g., A, B, C, etc. The material layers of the stack used for defining the trough, for example, layer A, is removed by employing a damage free process to maintain substrate integrity. Following subsequent processing steps that result in the trough being filled with a gate conductor, e.g., polysilicon, the gate conductor is polished back so that the gate conductor is planar with the top of material layer A. As indicated above, material layer A must be removed from the structure. Typically, the removal of this material layer is carried out utilizing a chemical etchant which is highly selective in removing the material layer as compared to the surrounding and/or underlying layers of the structure.

During the process of this removal, some of the gate conductor may be consumed. The consumption of some of the gate conductor during damascene etch back may effect the performance of the final device. An example of this is when material layer A of the stack is $Si_3N_4$ and the removal process is carried out with a hot phosphoric acid wet etch. If the gate conductor is polysilicon that has various dopants embedded therein, the isotropic etch of the polysilicon could proceed at between 1/30 to 1/60 the rate of the nitride removal. The isotropic nature of such an etch would result in thickness and line width variances of the resulting conductive lines.

In view of the above-mentioned drawback with prior art damascene gate formation processes, there is a continued need for developing a new and improved damascene gate formation process wherein the material layers used in defining the gate region can be removed without adversely the gate conductor and/or the device performance properties of the resulting structure.

SUMMARY OF THE INVENTION

The present invention provides a method of fabricating MOSFETs utilizing a damascene gate formation process in which the material layers of the gate stack, i.e., the material layers used in defining the trough, can be removed without damaging the gate conductor that is formed in the trough. This objective is achieved in the present invention by forming a silicon sidewall on vertical surfaces of a trough formed in a gate stack and thereafter oxidizing the silicon sidewalls. The oxidized silicon protects the sidewalls of the gate conductor during the removal of the various material layers of the gate stack.

The method of the present invention is particularly useful in fabricating a sub-0.05 μm MOSFET.

Specifically, the method of the present invention comprises the steps of:

(a) forming a gate stack on a surface of a silicon-containing substrate, said gate stack having at least a pad oxide layer formed on said surface of said silicon-containing substrate and a nitride layer formed on said pad oxide layer;

(b) forming a trough in said gate stack stopping on said pad oxide layer exposing a portion of said pad oxide layer, said trough having vertical sidewalls;

(c) forming a conformal silicon layer on said gate stack and in said trough, including said vertical sidewalls and said exposed pad oxide layer;

(d) removing the conformal silicon layer from said gate stack and said exposed pad oxide layer whereby silicon remains on the vertical sidewalls of said trough;

(e) removing the exposed pad oxide layer from said trough exposing a portion of the silicon-containing substrate;

(f) oxidizing the silicon on said vertical sidewalls of the trough and in said exposed silicon-containing substrate forming oxide layers in said vertical sidewalls and on said exposed silicon-containing substrate;

(g) forming doped polysilicon in said trough;

(h) performing a second oxidation step in which an oxide layer is formed on a top surface of said doped polysilicon;

(i) removing the remaining nitride layer of the gate stack forming a gate region which is protected on all sides by oxides; and (j) forming source and drain regions in said silicon-containing substrate.

In the above method, the silicon employed in step (c) may be undoped or doped. In a preferred embodiment of the present invention, the silicon is heavily doped utilizing conventional techniques well known in the art, i.e., ion implantation and activation anneal or by a conventional deposition process wherein doping is conducted in-situ. Doped silicon is preferred over undoped silicon in the present invention since the remaining doped material after oxidation is easy to etch using standard chemical etchants such as hot phosphoric acid. The term "heavily doped" is used in the present invention to denote a dopant concentration of about $10^{18}$ atoms/cm$^2$ or above.

DETAILED DESCRIPTION OF THE INVENTION

Figure 1A:
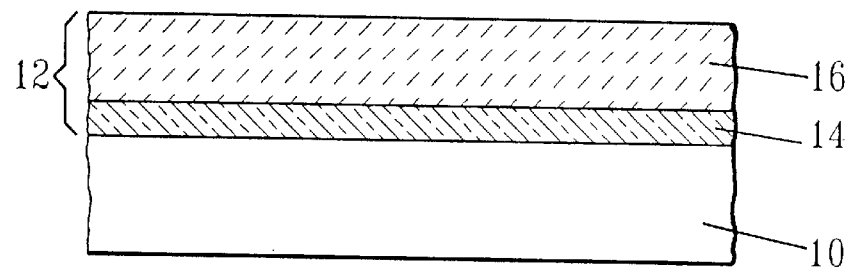
FIGS. 1A–H are cross-sectional views showing the various processing steps that are employed in the present invention in fabricating a FET in which the gate conductor is protected on all sides by oxide layers.

The present invention which provides a method of fabricating MOSFET devices in which the gate conductor is not consumed during gate damascene processing will now be described in greater detail by referring to the drawings that accompany the present application. It should be noted that in the accompanying drawings like reference numerals are used for describing like and corresponding elements of the drawings.

Reference is first made to FIG. 1A which illustrates an initial structure that can be employed in the present invention. Specifically, the initial structure shown in FIG. 1A comprises a Si-containing substrate 10 and a gate stack 12. The gate stack includes a pad oxide layer 14 such as $SiO_2$ which is formed on the surface of the silicon-containing substrate and a nitride layer 16 such as $Si_3N_4$ that is formed on the pad oxide layer. Although the drawings of the present invention depict a gate stack comprising two material layers, the gate stack may also comprise additional material layers. It is noted that in the embodiment in the drawings of the present invention, nitride layer 16 is used in defining the trough; therefore, that layer will be removed in a subsequent step to expose the gate region of the structure—the pad oxide layer remains on portions of the Si-containing substrate after damascene etch back of the nitride layer.

Pad oxide layer 14 is formed on the surface of silicon-containing substrate 10 using a conventional thermal growing process, or alternatively, the pad oxide layer may be formed by a conventional deposition process such as, but not limited to: chemical vapor deposition (CVD), plasma-assisted CVD, sputtering, evaporation and other like deposition processes. The thickness of the pad oxide layer may vary, but it should be thicker than the corresponding gate oxide which will be formed in a subsequent processing step. Typically, the pad oxide layer has a thickness of from about 8 to about 20 nm.

Insofar as nitride layer 16 is concerned, that layer is formed on the surface of pad oxide 14 utilizing conventional deposition processes well known in the art, including the same as mentioned hereinabove in forming the pad oxide layer. The thickness of the nitride layer may vary, but it should be thicker than the pad oxide in which it is formed thereon. Typically, in the present invention, nitride layer 16 of gate stack 12 has a thickness of from about 50 to about 200 nm.

The silicon-containing substrate employed in the present invention may be any conventional semiconductor substrate in which silicon is present therein. Examples of some silicon-containing substrates that may be employed in the present invention include, but are not limited to: Si (crystalline or polycrystalline), SiGe, silicon-on-insulators (SOIs) and layered substrates such as Si/SiGe. The silicon-containing substrate may be of the n-type or p-type depending on the desired device to be fabricated. The substrate may contain various active and/or isolation regions either formed on the substrate or formed in the substrate using processing techniques that are well known in the art.

Figure 1B:
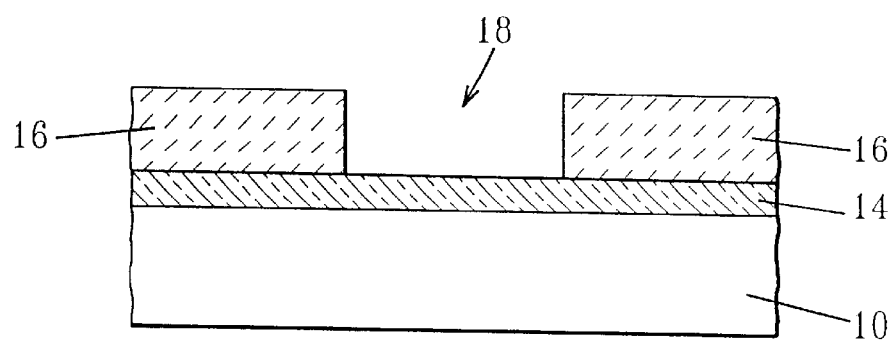

After forming gate stack 12 on silicon-containing substrate 10, a trough (or gate hole) 18 is formed in nitride layer 16 of the stack using conventional lithography and etching (reactive ion etching (RIE), plasma etching, ion beam etching and other like dry etch processes which do not substantially damage the underlying pad oxide layer), see FIG. 1B. As is shown therein, the trough extends through the nitride layer, but it stops on the uppermost layer of pad oxide 14 exposing a portion of that material layer. Although not shown in the drawings, the lithography step employs a conventional photoresist and optionally an anti-reflective coating, both of which are removed after the trough has been formed in the nitride layer. In the embodiment depicted in the drawings, only one trough is shown. In other embodiments of the present invention, a plurality of troughs may be formed.

Figure 1C:
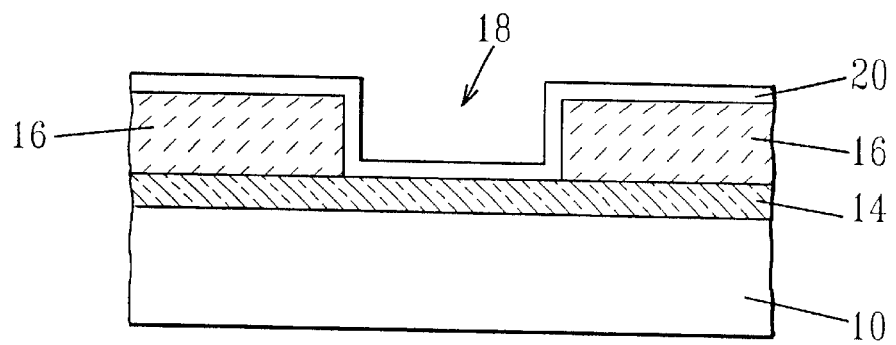

Next, as is shown in FIG. 1C, a conformal silicon layer 20 is formed on the exposed surfaces of the structure of FIG. 1B including the top surface of the patterned nitride layer, the vertical sidewalls of the trough and the exposed portion of the pad oxide layer. The conformal silicon layer is formed in the present invention by utilizing any conventional deposition process such as CVD or plasma-assisted CVD which is capable of forming a conformal layer of silicon on the structure. The thickness of the conformal silicon layer is not critical to the present invention, but typically the thickness of the conformal layer is from about 3 to about 10 nm.

The silicon employed in this step of the present invention may be polysilicon or amorphous silicon. The silicon may be undoped or doped with an appropriate dopant atom. As stated above, the use of heavily doped silicon is highly preferred since doped materials are much easier to remove with chemical etchants that are employed in subsequent processing steps of the present invention. The term "heavily doped" is used herein to denote a silicon layer in which the dopant concentration in that layer is about $10^{18}$ atoms/cm$^2$ or higher, preferably $10^{20}$ atoms/cm$^2$ or higher. The silicon may be doped by conventional means such as ion implantation after deposition, or alternatively, the doping may be done in-situ during the deposition process using conventional means that are also well known in the art. When ion implantation is used to dope the conformal silicon layer, the dopant is activated by conventional annealing processes well known to those skilled in the art.

Figure 1D:
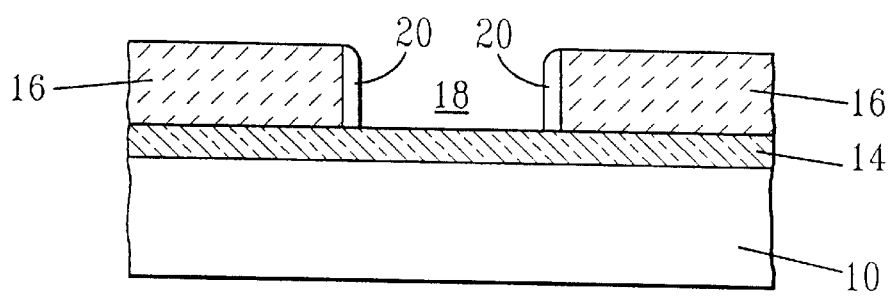

In accordance with the next step of the present invention, the conformal silicon layer is removed from all horizontal surfaces of the structure including the top layer of the patterned nitride layer and the portion of the oxide pad layer in the bottom of the trough providing the structure shown in FIG. 1D. As is shown therein, the removal process employed in the present invention leaves silicon on the vertical sidewalls of the trough. Thus, this step of the present invention provides a structure in which the sidewalls of trough 18 have silicon spacers formed thereon and it again exposes the pad oxide layer in the trough. To form the structure shown in FIG. 1D, the present invention employs the use of any conventional linear etch process such as reactive ion etching (RIE).

Figure 1E:
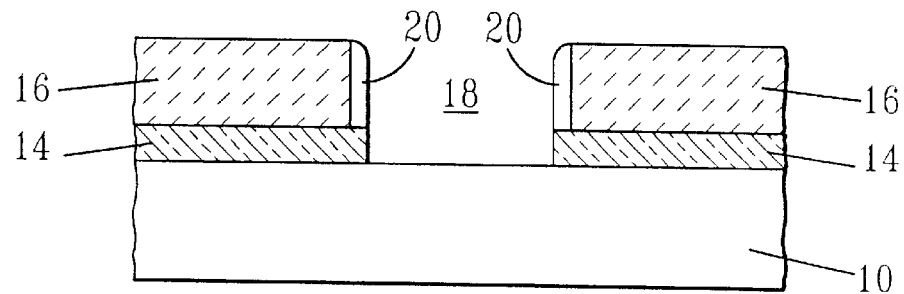

The next step of the present invention comprises removing the exposed portion of pad oxide layer 14 from the bottom of trough 18 so as to provide the structure illustrated in FIG. 1E. Specifically, the exposed portion of the pad oxide in the trough is removed by an etch process which is highly selective for removing oxide as compared to silicon. Suitable etch processes that can be employed in the present invention include, but are not limited to: a vapor phase chemical oxide removal process which is carried out under low pressures (6 millitorr or below) wherein a vapor of HF and $NH_3$ is employed as the etchant.

Figure 1F:
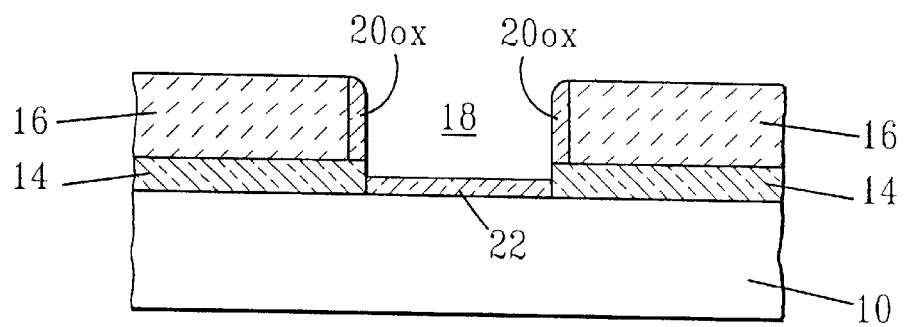

After opening the bottom of the trough so as to expose a portion of the silicon-containing substrate, the structure is subjected to a gate oxidation process which is capable of oxidizing silicon. Since silicon is present on the vertical sidewalls of the trough and since the substrate is composed of silicon, this oxidation step forms oxide regions in the silicon sidewalls and on the exposed portion of the semiconductor substrate. The resultant structure formed from this oxidation step is shown in FIG. 1F, wherein 20ox refers to the new oxide regions formed in the silicon that remain on the vertical sidewalls of the trough and 22 refers to an oxide region that is formed on the substrate. As is shown in FIG. 1F, element 22 is a thin oxide layer (thickness of 3 nm or less) which represents the gate oxide of the FET.

This oxidation step of the present invention need not convert all of the silicon on the vertical sidewalls of the trough to an oxide region. Indeed, some of the silicon formed on the vertical sidewalls of the trough may not be oxidized. The portions of the silicon layer on the sidewalls of the trough that are not oxidized are typically those that are closest to the nitride/silicon interface. In a preferred embodiment of the present invention, all portions of the silicon sidewall spacers are oxidized by this oxidation step of the present invention. It is noted that the drawings of the present application depict this preferred embodiment of the present invention.

To obtain the oxide regions in the structure, any conventional gate oxidation process may be employed. For example, the gate oxidation process may include: heating the structure in an oxidizing atmosphere such as air or oxygen at a temperature of from about 700° to about 800° C. for a time period of from about 5 to about 10 minutes. The heating may be performed at a single temperature or various ramp and soak cycles can be employed. Although reference is given to the above gate oxidation conditions, other temperatures and times which are capable of forming oxide regions in silicon can also be employed in the present invention. For example, rapid thermal oxidation (RTO) conditions may also be employed in the present invention.

Figure 1G:
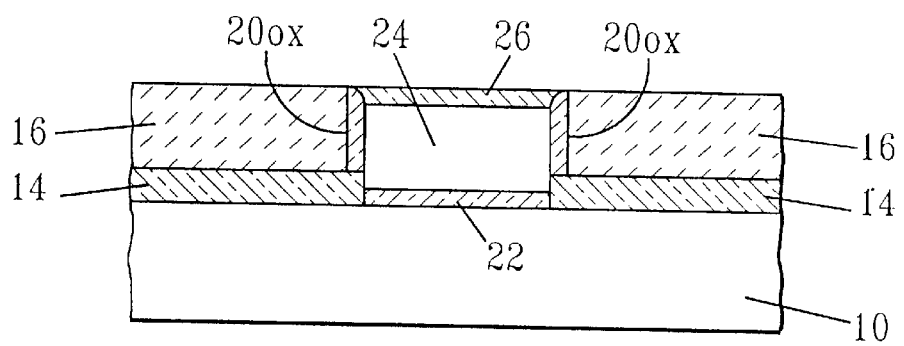

FIG. 1G shows the structure that results from steps (g), (h) and (i) of the present invention. Specifically, after the oxidation step, doped polysilicon 24 is formed in trough 18 utilizing a conventional deposition process such as CVD or plasma-assisted CVD and, if needed, the structure is planarized utilizing a conventional planarization process such as chemical-mechanical polishing (CMP). Doping of the polysilicon may be conducted in-situ during the deposition process, or alternatively, doping may be carried out after the deposition process using ion implantation or another like technique that is capable of doping the polysilicon. The structure is then subjected to a second oxidation step which is capable of forming a surface oxide layer 26 in doped polysilicon 24. The second oxidation step may be conducted utilizing the same or different processing techniques and conditions as used previously in forming oxide regions 20ox and 22.

The next step of the present invention comprises removing the remaining nitride layer of the gate stack (and optionally any silicon formed on the vertical sidewalls of the trough that was not previous oxidized) from the structure so as to expose the underlying pad oxide and to expose a gate region which is protected with oxide regions 20ox and 26. Source and drain regions 28 are then formed in the surface of the silicon substrate 10 utilizing conventional ion implantation and activation anneals that are typically employed in the art for forming such regions. The structure containing the oxide protected gate region is shown in FIG. 1H.

The nitride layer of the gate stack (and optional silicon layer 20 not previously oxidized) is removed by conventional etching processes well known in the art that are highly selective in removing nitride (and optional silicon) as compared to oxide. Specifically, the remaining nitride layer (and optional silicon layer not previously oxidized) may be removed by utilizing a wet etch process in which a chemical etchant such as, but not limited to: hot phosphoric acid is employed. Other chemical etchants as well as dry etching processes may also be employed in the present invention.

It is also possible to leave the silicon not previously oxidized on the structure after the above removal process. In such an embodiment, a third oxidation step would be performed to convert the remaining silicon into an oxide region. When a third oxidation step is performed, the same or different oxidation conditions as described above may be employed.

Figure 1H:
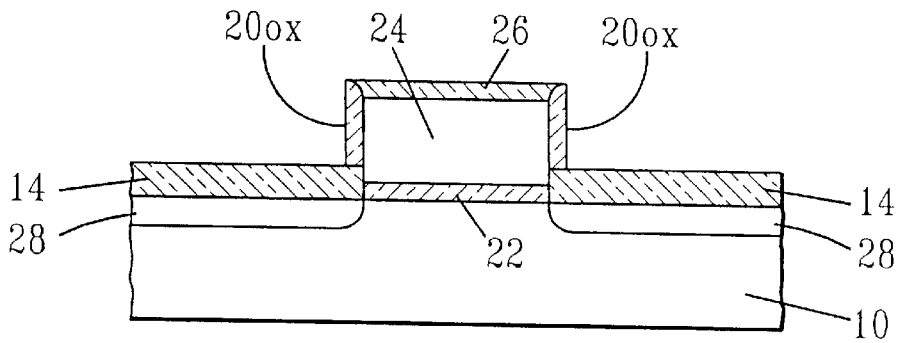

Following the various processing steps of the present invention, the structure shown in FIG. 1H may be subjected to various other device fabrication processing techniques which are well known to those skilled in the art. For example, the structure shown in FIG. 1H may be subjected to the CMOS device processing steps that are described in R. Colclaser, "Miro Electronics processing and Device Design, Chapter 10, pages 266–269, John Wiley and Sons publisher, 1980.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms and details described and illustrated, but fall within the scope of the appended claims.

Having thus described our invention in detail, what we claim is new, and desire to secure by the Letters Patent is:

1. A method of forming a MOSFET structure in which the gate polysilicon is not consumed during damascene etch back, said method comprising the steps of:

(a) forming a gate stack on a surface of a silicon-containing substrate, said gate stack having at least a pad oxide layer formed on said surface of said silicon-containing substrate and a nitride layer formed on said pad oxide layer;

(b) forming a trough in said gate stack stopping on said pad oxide layer exposing a portion of said pad oxide layer, said trough having vertical sidewalls;

(c) forming a conformal silicon layer on said gate stack and in said trough, including said vertical sidewalls and said exposed pad oxide layer;

(d) removing the conformal silicon layer from said gate stack and said exposed pad oxide layer whereby silicon remains on the vertical sidewalls of said trough;

(e) removing the exposed pad oxide layer from said trough exposing a portion of the silicon-containing substrate;

(f) oxidizing the silicon on said vertical sidewalls of the trough and in said exposed silicon-containing substrate forming oxide layers in said vertical sidewalls of the trough and on said exposed silicon-containing substrate;

(g) forming doped polysilicon in said trough;

(h) performing a second oxidation step in which an oxide layer is formed on a top surface of said doped polysilicon;

(i) removing the remaining nitride layer of the gate stack forming a gate region which is protected on all sides by oxides; and (j) forming source and drain regions in said silicon-containing substrate.

2. The method of claim 1 wherein said pad oxide layer is formed by a deposition process or a thermal growing process.

3. The method of claim 2 wherein said deposition process is selected from the group consisting of chemical vapor deposition (CVD), plasma-assisted CVD, sputtering and evaporation.

4. The method of claim 1 wherein said pad oxide layer is composed of $SiO_2$.

5. The method of claim 1 wherein said pad oxide layer has a thickness of from about 8 to about 20 nm.

6. The method of claim 1 wherein said nitride layer is formed by a deposition process selected from the group consisting of CVD, plasma-assisted CVD, sputtering and evaporation.

7. The method of claim 1 wherein said nitride layer is composed of $Si_3N_4$.

8. The method of claim 1 wherein said nitride layer has a thickness of from about 50 to 200 nm.

9. The method of claim 1 wherein said silicon-containing substrate is selected from the group consisting of Si, silicon-on-insulators, SiGe and a Si/SiGe layered substrate.

10. The method of claim 1 wherein step (b) includes lithography and etching.

11. The method of claim 10 wherein said etching is a dry etch process selected from the group consisting of reactive ion etching (RIE), plasma etching and ion beam etching.

12. The method of claim 1 wherein said conformal silicon layer is composed of polysilicon or amorphous silicon.

13. The method of claim 12 wherein said conformal silicon layer is doped with a dopant to provide a silicon layer having a dopant concentration of $10^{18}$ atoms/cm$^2$ or higher.

14. The method of claim 12 wherein said conformal silicon layer is undoped.

15. The method of claim 1 wherein said conformal silicon layer has a thickness of from about 3 to about 10 nm.

16. The method of claim 1 wherein said conformal silicon layer is formed by a deposition process selected from the group consisting of CVD and plasma-assisted CVD.

17. The method of claim 1 wherein step (d) includes a linear etch process.

18. The method of claim 1 wherein step (e) is carried out by a vapor phase chemical oxide removal process wherein a vapor of HF and $NH_3$ is employed as the etchant, said oxide removal process being carried out at a pressure of 6 millitorr or below.

19. The method of claim 1 wherein step (f) is carried out in an oxidizing atmosphere at a temperature of from about 700° to about 800° C. for a time period of from about 1 to about 5 minutes.

20. The method of claim 1 wherein step (f) does not oxidize all of the conformal silicon layer.

21. The method of claim 1 wherein said second oxidizing step is carried out using the same or different conditions as step (f).

22. The method of claim 1 wherein step (i) is carried out by a damascene etch back process.

23. The method of claim 22 wherein said damascene etch back process employs the use of hot phosphoric acid.

24. The method of claim 20 wherein a third oxidation step is employed to oxidize the conformal silicon layer not previously oxidized.

* * * * *

UNITED STATES PATENT AND TRADEMARK OFFICE
CERTIFICATE OF CORRECTION

PATENT NO. : 6,258,679 B1
DATED : July 10, 2001
INVENTOR(S) : Stuart M. Burns et al.

It is certified that error appears in the above-identified patent and that said Letters Patent is hereby corrected as shown below:

<u>Title page,</u>
Item [56], References Cited, U.S. PATENT DOCUMENTS: delete
-- 5,434,093    7/1995    Cahu et al.
5,538,913    7/1996    Hong
5,963,818    10/1999    Kao et al.
5,985,726    11/1999    Yu et al.
6,015,727    1/2000    Wanlass
6,054,355    4/2000    Inumiya et al.
6,063,699    5/2000    Hanafi et al.
6,114,206    9/2000    Yu
6,117,741    9/2000    Chatterjee et al.
6,194,301    2/2001    Radens et al.
6,200,865    3/2001    Gardner et al.
6,204,133    3/2001    Yu et al. --

Signed and Sealed this

Twenty-seventh Day of August, 2002

*Attest:*

JAMES E. ROGAN
*Attesting Officer*    *Director of the United States Patent and Trademark Office*